United States Patent
Ogashiwa et al.

(10) Patent No.: US 10,212,813 B2
(45) Date of Patent: Feb. 19, 2019

(54) RESIN COMPOSITION, PREPREG, AND LAMINATED SHEET

(75) Inventors: Takaaki Ogashiwa, Kashima (JP); Hiroshi Takahashi, Misato (JP); Tetsuro Miyahira, Shirakawa (JP); Yoshihiro Kato, Abiko (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 13/639,351

(22) PCT Filed: Apr. 7, 2011

(86) PCT No.: PCT/JP2011/058791
§ 371 (c)(1),
(2), (4) Date: Dec. 20, 2012

(87) PCT Pub. No.: WO2011/126070
PCT Pub. Date: Oct. 13, 2011

(65) Prior Publication Data
US 2013/0089743 A1    Apr. 11, 2013

(30) Foreign Application Priority Data

Apr. 8, 2010 (JP) .................................. 2010-89801

(51) Int. Cl.
| | | |
|---|---|---|
| B32B 27/08 | (2006.01) | |
| B32B 27/38 | (2006.01) | |
| H05K 1/05 | (2006.01) | |
| C08G 59/40 | (2006.01) | |
| C08G 59/62 | (2006.01) | |
| C08J 5/24 | (2006.01) | |
| C09D 163/00 | (2006.01) | |
| C08K 3/22 | (2006.01) | |
| C08L 63/00 | (2006.01) | |
| C08L 71/00 | (2006.01) | |
| C09D 171/00 | (2006.01) | |
| C08K 5/3415 | (2006.01) | |
| C08K 3/013 | (2018.01) | |

(52) U.S. Cl.
CPC ......... *H05K 1/056* (2013.01); *C08G 59/4042* (2013.01); *C08G 59/621* (2013.01); *C08J 5/24* (2013.01); *C08K 3/22* (2013.01); *C08L 63/00* (2013.01); *C08L 71/00* (2013.01); *C09D 163/00* (2013.01); *C09D 171/00* (2013.01); *C08J 2363/00* (2013.01); *C08K 3/013* (2018.01); *C08K 5/3415* (2013.01); *Y10T 428/31529* (2015.04)

(58) Field of Classification Search
None
See application file for complete search history.

(56) References Cited

U.S. PATENT DOCUMENTS

| | | | |
|---|---|---|---|
| 6,551,714 B1 | 4/2003 | Tobisawa | |
| 2002/0106516 A1* | 8/2002 | Sato et al. | 428/413 |
| 2006/0216520 A1 | 9/2006 | Osada | |
| 2007/0295607 A1* | 12/2007 | Kawai | 205/164 |
| 2008/0187763 A1 | 8/2008 | Kato et al. | |
| 2009/0017316 A1 | 1/2009 | Kato et al. | |
| 2009/0104429 A1* | 4/2009 | Goto et al. | 428/319.3 |
| 2009/0326100 A1* | 12/2009 | Hamada et al. | 523/435 |
| 2011/0036625 A1* | 2/2011 | Narahashi et al. | 174/261 |
| 2012/0018072 A1* | 1/2012 | Ueno et al. | 156/60 |

FOREIGN PATENT DOCUMENTS

| | | |
|---|---|---|
| CN | 1306041 | 8/2001 |
| CN | 101240111 | 8/2008 |
| EP | 1116774 | 7/2001 |
| JP | 9-3167 A | 1/1997 |
| JP | 11-124489 A | 5/1999 |
| JP | 2001-226465 A | 8/2001 |
| JP | 2001-254001 A | 9/2001 |
| JP | 2001-283639 A | 10/2001 |
| JP | 2003-138103 A | 5/2003 |
| JP | 2004-67968 A | 3/2004 |
| JP | 2006-249343 A | 9/2006 |
| JP | 2006-299246 A | 11/2006 |
| JP | 2008-127530 A | 6/2008 |
| JP | 2008-214602 A | 9/2008 |
| JP | 2009-35728 A | 2/2009 |
| JP | 2010-229227 A | 10/2010 |
| KR | 2001-0076181 | 8/2001 |
| KR | 10-2008-0074037 | 8/2008 |

(Continued)

OTHER PUBLICATIONS

The Center for Construction Research and Training, Work Safely with Silica—Ask a Question, 2012. http://www.silica-safe.org/ask-a-question/faq.*

U.S. Appl. No. 13/581,926 to Takaaki Ogashiwa et al., filed Aug. 30, 2012.

Search report from International Application No. PCT/JP2011/058791, dated May 31, 2011.

(Continued)

*Primary Examiner* — Coris Fung

(74) *Attorney, Agent, or Firm* — Greenblum & Bernstein, P.L.C.

(57) ABSTRACT

There is provided a resin composition for printed wiring boards that, while maintaining excellent flame retardance, has excellent heat resistance, reflow resistance, and drilling workability, and, at the same time, has low water absorption without use of halogen compounds and phosphorus compounds. The resin composition comprises (A) a non-halogen epoxy resin, (B) a biphenyl aralkyl phenolic resin, (C) a maleimide compound and (D) an inorganic filler.

10 Claims, No Drawings

(56) References Cited

FOREIGN PATENT DOCUMENTS

WO     WO2009107760    *   9/2009

OTHER PUBLICATIONS

International Preliminary Report on Patentability Application No. PCT/JP2011/058791, dated Nov. 15, 2012.
Search Report issued in European Patent Application No. 11765970.6, dated Oct. 15, 2015.

* cited by examiner

RESIN COMPOSITION, PREPREG, AND LAMINATED SHEET

TECHNICAL FIELD

The present invention relates to a resin composition and more particularly relates to a resin composition for use in prepregs for printed wiring boards, a prepreg comprising the resin composition impregnated into or coated on a base material, and a laminated sheet comprising a cured product of the prepreg.

BACKGROUND OF THE INVENTION

Heat curable resins develop high heat resistance and dimensional accuracy by virtue of their crosslinked structure and thus have been expensively used in fields where high reliability is required, for example, in electronic components. There is an ever-increasing recent tendency toward an increase in density, for example, in printed wiring boards prepared using heat curable resins. For example, high adhesion to copper foils for micro wiring formation and machinability in hole making by drilling or punching are required of copper-clad laminated sheets. Further, for electronic components, mounting by lead-free solder and imparting flame retardance without use of halogens have become required from the viewpoint of recent environmental problems, and higher heat resistance and flame retardance than those of conventional heat curable resins are required of heat curable resins for copper-clad laminated sheets. Furthermore, from the viewpoint of improving safety of products and work environments, heat curable resin compositions that are composed of low-toxic ingredients only and do not evolve toxic gas and the like have been desired.

Phosphorus compounds have been proposed as halogen-free flame retardants as an alternative to bromine-containing flame retardants. Phosphorus compounds used in flame retardation include phosphoric esters such as triphenyl phosphate and cresyl diphenyl phosphate. Phosphoric esters have poor resistance to alkalis and thus pose a problem that, in producing printed boards using phosphoric ester-containing epoxy resins and the like, desmear treatment or roughening process disadvantageously causes decomposition of phosphoric acid compounds, disadvantageously leading to elution of material ingredients or an increase in water absorption of the formed printed boards (patent documents 1 to 3). Further, plasticity of these phosphoric acid compounds leads to disadvantageous phenomena such as lowered glass transition points of the resins or lowered breaking strength and fracture elongation.

In order to solve the above problems, incorporation of a phosphorus compound in an epoxy resin skeleton has been proposed (patent document 4), and it is considered that this method can reduce the problem of elution of the phosphorus compound into the treatment liquid in the desmear treatment or the roughening process and the problem of lowering in glass transition point of the resins.

Epoxy or phenolic resins with a phosphorus compound incorporated in a skeleton thereof, however, are disadvantageous in that they are expensive and, further, a large amount of phosphorus compounds should be incorporated in the resins to provide satisfactory flame retardance, leading to a deterioration in various properties of resin compositions. Furthermore, phosphorus compounds, when burned, may disadvantageously evolve toxic compounds such as phosphine.

Metal hydrates are known as flame retardants other than phosphorus compounds. For example, aluminum hydroxide is known as a flame retardant that, when heated, causes a reaction that releases water of crystallization (patent document 5). The incorporation of aluminum hydroxide into resins, when the amount of gibbsite that is a general structure of aluminum hydroxide is large, sometimes leads to lowered heat resistance of resins due to an influence of water of crystallization that is released upon heating. Further, amino triazine skeleton-containing phenolic resins that are nitrogen-containing resins have also been proposed as other flame retardants (see patent document 6). When the amount of these resins incorporated is large, heat resistance is sometime lowered due to the evolution of decomposition gas upon heating.

When the above metal hydrates that are flame retardants other than the bromine-containing flame retardants or phosphorus compounds are used, the content of the inorganic filler in the resin composition is so high that the resultant resin is hard and brittle. As a result, the abrasion speed of drill bits is high, and, hence, for example, the frequency of replacement of drill bits is increased due to breakage of drill bits or lowered accuracy of hole positions, that is, disadvantageously, the drilling workability is significantly lowered.

PRIOR ART DOCUMENTS

Patent Documents

Patent document 1: Japanese Patent Application Laid-Open No. 124489/1999
Patent document 2: Japanese Patent Application Laid-Open No. 254001/2001
Patent document 3: Japanese Patent Application Laid-Open No. 067968/2004
Patent document 4: Japanese Patent Application Laid-Open No. 283639/2001
Patent document 5: Japanese Patent Application Laid-Open No. 226465/2001
Patent document 6: Japanese Patent Application Laid-Open No. 127530/2008

SUMMARY OF THE INVENTION

Accordingly, an object of the present invention is to provide a resin composition for printed wiring boards that, while maintaining excellent flame retardance, has excellent heat resistance, reflow resistance, and drilling workability, and, at the same time, has low water absorption without use of halogen compounds and phosphorus compounds.

According to the present invention, there is provided a resin composition comprising:
 (A) a non-halogen epoxy resin;
 (B) a biphenyl aralkyl phenolic resin;
 (C) a maleimide compound; and
 (D) an inorganic filler.

According to other aspects of the present invention, there are provided a prepreg comprising the above resin composition impregnated into or coated on a base material, a laminated sheet comprising a cured product of the prepreg, and a metal foil-clad laminated sheet comprising a cured product of a stack of the prepreg and a metal foil.

The present invention can realize a resin composition for printed wiring boards that, while maintaining excellent flame retardance, has excellent heat resistance, reflow resistance, and drilling workability, and, at the same time, has low water absorption without use of halogen compounds and phosphorus compounds. Consequently, laminated sheets obtained by curing prepregs comprising the resin composition according to the present invention impregnated into or coated on base materials or metal foil-clad laminated sheets obtained by providing metal foils on the laminated sheets, despite the fact that neither halogen compounds nor phosphorus compounds are contained, have a high level of flame retardance, low water absorption, and excellent drilling workability, and are suitable as center core materials for semiconductor plastic packages where heat resistance, reflow resistance, reliability, and productivity are required.

DETAILED DESCRIPTION OF THE INVENTION

The resin composition according to the present invention comprises (A) a non-halogen epoxy resin, (B) a biphenyl aralkyl phenol resin, (C) a maleimide compound, and (D) an inorganic filler as indispensable ingredients. Individual ingredients constituting the resin composition according to the present invention will be described.

<Non-Halogen Epoxy Resin (A)>

Any compound that contains two or more epoxy groups per molecule and is free from a halogen atom within the molecular skeleton may be used as the non-halogen epoxy resin (A) used in the present invention without particular limitation. Examples of such non-halogen epoxy resins include bisphenol A epoxy resins, bisphenol F epoxy resins, phenol novolak epoxy resins, cresol novolak epoxy resins, bisphenol A novolak epoxy resins, trifunctional phenol epoxy resins, tetrafunctional phenol epoxy resins, naphthalene epoxy resin, biphenyl epoxy resins, aralkyl novolak epoxy resins, alicyclic epoxy resins, polyol epoxy resins, compounds obtained by epoxidizing a double bond, for example, in glycidylamines, glycidyl esters, and butadiene, and compounds obtained by reacting hydroxyl-containing silicone resins with epichlorohydrin. Among them, aralkyl novolak epoxy resins are preferred from the viewpoint of flame retardance. Such aralkyl novolak epoxy resins include phenol phenyl aralkyl epoxy resins, phenol biphenyl aralkyl epoxy resins, and naphthol aralkyl epoxy resins. The non-halogen epoxy resins (A) may be used solely or in a combination of two or more of them.

Preferably, the content of the non-halogen epoxy resin (A) is 20 to 60 parts by weight based on 100 parts by weight in total amount of the resins. Here the total amount of the resins refers to the total weight of the non-halogen epoxy resin (A), the biphenyl aralkyl phenol resin (B), and the maleimide compound (C).

<Biphenyl Aralkyl Phenol Resin (B)>

The biphenyl aralkyl phenol resin (B) used in the present invention is a resin represented by formula (I) that contains two or more phenolic hydroxyl groups per molecule.

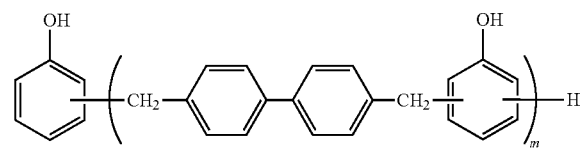

(I)

wherein m is an integer of 1 or more.

Preferably, the content of the biphenyl aralkyl phenol resin (B) is 0.7 to 1.4 in terms of an OH/Ep ratio wherein OH represents the number of hydroxyl groups in the biphenyl aralkyl phenol resin; and Ep represents the number of epoxy groups in the non-halogen epoxy resin (A). When the content of the biphenyl aralkyl phenol resin (B) is in the above-defined range in terms of the OH/Ep ratio, the heat resistance can be improved while maintaining the glass transition temperature. The specific content of the biphenyl aralkyl phenol resin (B) is preferably 5 to 55 parts by weight based on the total amount of the resins from the viewpoints of the glass transition temperature and heat resistance although the content of the biphenyl aralkyl phenol resin (B) may also vary depending upon the content of the non-halogen epoxy resin (A).

The biphenyl aralkyl phenol resin (B) may be synthesized by publicly known methods. The weight average molecular weight of the biphenyl aralkyl phenol resin (B) is preferably about 500 to 8,000. The biphenyl aralkyl phenol resin (B) may be a commercially available product. For example, KAYAHARD GPH-103 (manufactured by Nippon Kayaku Co., Ltd.) is suitable as the biphenyl aralkyl phenol resin (B).

In addition to the biphenyl aralkyl phenol resin (B), other naphthol resins and/or phenolic resins may be additionally used in such an amount that does not sacrifice the effect of the present invention. Any compound comprising an aromatic ring, two or more of hydrogen atoms per molecule of which have been substituted by a hydroxyl group may be used as other naphthol resins and/or phenolic resins without particular limitation. Examples thereof include naphthol aralkyl resins, phenol novolak resins, alkyl phenol novolak resins, bisphenol A novolak resins, dicyclopentadiene phenol resins, xylok phenol resins, terpene-modified phenol resins, polyvinyl phenols, and aralkyl phenol resins. Among them, a naphthol aralkyl resin (E) represented by formula (II) is preferred from the viewpoints of heat resistance and water absorption.

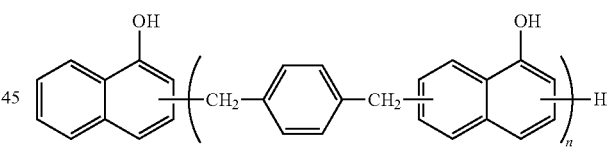

(II)

wherein n is an integer of 1 or more.

The amount of the naphthol aralkyl resin (E) incorporated is preferably not more than 80% by weight based on the whole amount of the phenolic resins containing the biphenyl aralkyl phenol resin (B) from the viewpoints of flame retardance, drilling workability, low water absorption, and heat resistance.

The naphthol aralkyl resin (E) may be synthesized by a publicly known method. The weight average molecular weight of the naphthol aralkyl resin (E) is about 200 to 1,000. The naphthol aralkyl resin (E) may be a commercially available product, and, for example, SN-495 (manufactured by Nippon Steel Chemical Co., Ltd.) is suitable for use.

<Maleimide Compound (C)>

In the present invention, any compound containing one or more maleimide groups per molecule may be used as the maleimide compound (C) without particular limitation. Examples thereof include N-phenylmaleimide, N-hydrophenylmaleimide, bis(4-maleimidophenyl)methane, 2,2-bis{4-

(4-maleimidophenoxy)-phenyl}propane, bis(3,5-dimethyl-4-maleimidophenyl)methane, bis(3-ethyl-5-methyl-4-maleimidophenyl)methane, and bis(3,5-diethyl-4-maleimidophenyl)methane. The bismaleimide compounds may be in a monomer form, as well as in a prepolymer form or in the form of a prepolymer of the bismaleimide compound and an amine compound. These maleimide compounds (C) may be used solely or in a combination of two or more of them. Among them, bis(4-maleimidophenyl)methane, 2,2-bis{4-(4-maleimidophenoxy)-phenyl}propane, and bis(3-ethyl-5-methyl-4-maleimidophenyl)methane are preferred from the viewpoint of heat resistance.

The content of the maleimide compound (C) is preferably 5 to 50 parts by weight, more preferably 5 to 20 parts by weight, based on 100 parts by weight of the total amount of the resins from the viewpoints of heat resistance, reflow resistance, and low water absorption.

<Inorganic Filler (D)>

In the present invention, any inorganic filler commonly used in resin compositions for electric wiring boards may be used as the inorganic filler (D) without particular limitation. Examples thereof include silicas such as naturally occurring silica, fused silica, amorphous silica, and hollow silica, boehmite, molybdenum compounds such as molybdenum oxide and zinc molybdate, alumina, talc, calcined talc, mica, glass short fibers, and spherical glass (for example finely divided glass such as E-glass, T-glass, and D-glass). The inorganic fillers may be used solely or in a combination of two or more of them. Among the inorganic fillers, boehmite is preferred from the viewpoints of flame retardance and heat resistance.

Preferably, the inorganic filler (D) has an average particle diameter (D50) of 0.2 to 5 μm from the viewpoint of dispersibility. D50 means a median diameter which is a diameter that, when a measured particle size distribution of the powder is divided into two groups, the amount of particles on a coarser side is equal to the amount of particles on a finer side. The D50 value of the inorganic filler is generally measured by a wet laser diffraction-scattering method.

The content of the inorganic filler (D) is preferably 50 to 150 parts by weight, more preferably 50 to 140 parts by weight, based on 100 parts by weight of the total amount of the resins. When the content of the inorganic filler (D) is in the above-defined range, a high level of heat resistance and a high level of moldability can be simultaneously realized.

The inorganic filler (D) may be added solely to the resin composition, or alternatively may be added in combination with silane coupling agents or wetting/dispersing agents. Any silane coupling agent commonly used in surface treatment of inorganic materials may be used as the silane coupling agent without particular limitation. Examples thereof include, but are not limited to, aminosilane coupling agents such as γ-aminopropyltriethoxysilane and N-β-(aminoethyl)-γ-aminopropyltrimethoxysilane, epoxysilane coupling agents such as γ-glycidoxypropyltrimethoxysilane, vinylsilane coupling agents such as γ-methacryloxypropyltrimethoxysilane, cationic silane coupling agents such as N-β-(N-vinylbenzylaminoethyl)-γ-aminopropyltrimethoxysilane hydrochloride, and phenylsilane coupling agents. The coupling agents may be used solely or in a combination of two or more of them.

Any dispersion stabilizer commonly used for coating materials may be used as the wetting/dispersing agent without particular limitation. These dispersion stabilizers may be commercially available products, and examples of suitable commercially available dispersion stabilizers include Disperbyk-110, Disperbyk-111, Disperbyk-180, Disperbyk-161, BYK-W996, BYK-W9010, and BYK-W903 manufactured by Bik-Chemie Japan K.K.

<Silicone Powder (F)>

The resin composition according to the present invention may if necessary contain a silicone powder (F). The silicone powder (F) functions as a flame-retarding auxiliary that retards combustion and enhances a flame retarding effect. The silicone powder (F) suitable for use include a finely divided product of polymethylsilsesquioxane in which siloxane bonds have been crosslinked in a three-dimensional network form, a finely divided product of an addition polymerization product of vinyl-containing dimethylpolysiloxane and methylhydrogenpolysiloxane, a product obtained by coating a surface of a finely divided product of an addition polymerization product of vinyl-containing dimethylpolysiloxane and methylhydrogenpolysiloxane with polymethylsilsesquioxane in which siloxane bonds have been crosslinked in a three-dimensional network form, and a product obtained by coating a surface of an inorganic carrier with polymethylsilsesquioxane in which siloxane bonds have been crosslinked in a three-dimensional network form. Preferably, these silicone powders (F) have an average particle diameter (D50) of 1 to 15 μm from the viewpoint of dispersibility.

The content of the silicone powder is preferably 1 to 30 parts by weight, more preferably 1 to 20 parts by weight, based on 100 parts by weight in total of the resins. When the content of the silicone powder exceeds 30 parts by weight, the moldability and the dispersibility are sometimes lowered.

<Other Ingredients>

The resin composition according to the present invention may if necessary contain other ingredients in addition to the above ingredients. Examples of curing accelerators that may be contained for properly regulating the curing speed include imidazoles such as 2-methylimidazole, 2-ethylimidazole, 2-phenylimidazole, 2-ethyl-4-methylimidazole, tertiary amines such as 2-(dimethylaminomethyl)phenol, triethylenediamine, triethanolamine, and 1,8-diazabicyclo(5,4,0)undecene-7, organophosphines such as triphenylphosphine, diphenylphosphine, and tributylphosphine, metal compounds such as zinc octylate, and tetraphenylboron salts such as tetraphenylphosphonium tetraphenyl borate, tetraphenylphosphonium ethyltriphenyl borate, 2-ethyl-4-methylimidazole tetraphenyl borate, and N-methylmorpholine tetraphenyl borate. The curing accelerators may be used solely or in a combination of two or more of them. The addition amount of the curing accelerator can be properly regulated, for example, from the viewpoints of the degree of curing of the resins and the viscosity of the resin composition and is generally about 0.01 to 15 parts by weight based on 100 parts by weight in total of the resins.

The resin composition according to the present invention may further contain various polymer compounds such as other heat curable resins, thermoplastic resins, and oligomers and elastomers thereof, other flame retarding compounds, and additives in such an amount that does not sacrifice desired properties. They may be generally used without particular limitation as long as they are commonly used in resin compositions for printed wiring boards. Examples of flame retarding compounds include nitrogen-containing compounds such as melamine and benzoguanamine and oxazine ring-containing compounds. Additives include, for example, ultraviolet absorbers, antioxidants, photopolymerization initiators, fluorescent brighteners, photosensitizers, dyes, pigments, thickeners, lubricants, antifoaming agents, dispersants, leveling agents, brighteners, and polymerization inhibitors. These additives may be used solely or in a proper combination of two or more of them according to need.

<Prepreg>

The prepreg according to the present invention comprises the resin composition impregnated into or coated on a base material. Publicly known base materials used in various materials for printed wiring boards may be used as the base material. Examples thereof include glass fibers such as E-glass, D-glass, S-glass, NE-glass, T-glass, and Q-glass fibers, inorganic fibers other than the glass fibers, or organic fibers such as polyimide, polyamide, and polyester fibers. These base materials may be properly selected depending upon contemplated applications and properties. Among them, E-glass fibers are more preferred from the viewpoint of an excellent balance between the coefficient of thermal expansion in a plane direction and the drilling workability.

Any form of base materials that can be impregnated or coated with the resin composition may be used without particular limitation. Examples thereof include woven fabrics, nonwoven fabrics, rovings, chopped strand mats, and surfacing mats. The thickness of the base material is generally approximately 0.01 to 0.30 mm but is not limited to this thickness range.

The prepreg according to the present invention can be produced by impregnating into or coating on the base material with the resin composition. For example, the prepreg may be produced by impregnating into or coating on the base material with a resin varnish comprising the resin composition and an organic solvent and heating the impregnated or coated base material in a drier of 100 to 200° C. for 1 to 60 min to semi-cure the resin. The amount of the resin composition (including the inorganic filler) deposited on the base material is preferably in the range of 20 to 90% by weight based on the whole prepreg.

The organic solvent is used to lower the viscosity of the resin composition, improve the handleability, and, at the same time, enhance impregnation of the resin composition into the glass cloth. Any organic solvent may be used in the resin varnish without particular limitation as long as the non-halogen epoxy resin (A), the biphenyl aralkyl phenol resin (B), and the maleimide compound (C) can be dissolved therein. Examples thereof include, but are not limited to, ketones such as acetone, methyl ethyl ketone, methyl isobutyl ketone, and cyclohexanone, aromatic hydrocarbons such as benzene, toluene, and xylene, and amides such as dimethylformamide and dimethylacetamide. One of or a proper combination of two or more of these organic solvents may be used.

<Laminated Sheet>

The laminated sheet according to the present invention comprises a molded (cured) product of the prepreg or a stack of a plurality of sheets of the prepreg. The laminated sheet is produced by providing a single sheet of the prepreg or a stack of a plurality of sheets of the prepreg, placing a metal foil of copper or aluminum provided on one surface or both surfaces of the single prepareg or the stack according to need, and subjecting the assembly to molding (curing). Any metal foil used in materials for printed wiring boards may be used without particular limitation. Techniques for conventional laminated sheets for printed wiring boards or multi-layered boards may be adopted in the lamination molding. For example, the lamination molding is generally carried out under conditions of the use of a multistage press, a multistage vacuum press, a continuous molding machine, an autoclave molding machine or the like, a temperature of 100 to 300° C., a pressure of 2 to 100 kgf/cm$^2$, and a heating time of 0.05 to 5 hr. Further, in the present invention, a multi-layered board can be formed by lamination molding of a combination of the prepreg with a separately provided wiring board for an internal layer.

EXAMPLES

The present invention is further illustrated by the following Examples and Comparative Examples. However, the present invention is not to be construed as being limited to them.

Example 1

<Preparation of Resin Composition>

A biphenyl aralkyl phenol resin (KAYAHARD GPH-103, manufactured by Nippon Kayaku Co., Ltd., hydroxyl equivalent: 231 g/eq.) (35 parts by weight), 50 parts by weight of a biphenylaralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric, and the impregnated and coated E-glass woven fabric was heat-dried at 160° C. for 5 min to obtain a prepreg having a resin content of 47.5% by weight.

<Preparation of Metal Foil-Clad Laminated Sheet>

Four sheets of the prepreg were superimposed on each other to constitute a stack. A 12 μm-thick electrolytic copper foil (3EC-III, manufactured by MITSUI MINING & SMELTING CO., LTD.) was disposed on the upper surface and the lower surface of the stack, followed by lamination molding under conditions of a pressure of 30 kgf/cm$^2$, a temperature of 220° C., and a time of 120 min to obtain a copper-clad laminated sheet having a 0.4 mm-thick insulating layer.

Example 2

A biphenyl aralkyl phenol resin (KAYAHARD GPH-103, manufactured by Nippon Kayaku Co., Ltd., hydroxyl equivalent: 231 g/eq.) (20 parts by weight), 20 parts by weight of a naphthol aralkyl resin (SN-495, manufactured by Nippon Steel Chemical Co., Ltd., hydroxyl equivalent: 236 g/eq.), 45 parts by weight of a biphenylaralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, a wetting/dispersing agent (BYK-W903, manufactured by Bik-Chemie Japan K.K.) (1.5 parts by weight), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric, and the impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 3

A biphenyl aralkyl phenol resin (KAYAHARD GPH-103, manufactured by Nippon Kayaku Co., Ltd., hydroxyl equivalent: 231 g/eq.) (15 parts by weight), 15 parts by weight of a cresol novolak resin (PHENOLITE KA-1165, manufactured by DIC, hydroxyl equivalent: 119 g/eq.), 55 parts by weight of a biphenylaralkyl epoxy resin (NC-3000-FH, epoxy equivalent: 321 g/eq., manufactured by Nippon Kayaku Co., Ltd.), and parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric, and the impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 4

A biphenyl aralkyl phenol resin (KAYAHARD GPH-103, manufactured by Nippon Kayaku Co., Ltd., hydroxyl equivalent: 231 g/eq.) (15 parts by weight), 15 parts by weight of a phenol novolak resin (TD-2090, manufactured by DIC, hydroxyl equivalent: 105 g/eq.), and 55 parts by weight of a biphenylaralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 5

A biphenyl aralkyl phenol resin (KAYAHARD GPH-103, manufactured by Nippon Kayaku Co., Ltd., hydroxyl equivalent: 231 g/eq.) (15 parts by weight), 15 parts by weight of a naphthalene skeleton phenol resin (EPICLON EXB-9500, manufactured by DIC, hydroxyl equivalent: 153 g/eq.), and 55 parts by weight of a biphenylaralkyl epoxy resin (NC-3000-FH, epoxy equivalent: 321 g/eq., manufactured by Nippon Kayaku Co., Ltd.), and 15.0 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 6

A biphenyl aralkyl phenol resin (KAYAHARD GPH-103, manufactured by Nippon Kayaku Co., Ltd., hydroxyl equivalent: 231 g/eq.) (35 parts by weight), 50 parts by weight of a biphenylaralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), 20 parts by weight of a silicone rubber powder having a silicone resin-coated surface (silicone composite powder KMP-605, manufactured by The Shin-Etsu Chemical Co., Ltd.), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 7

A biphenyl aralkyl phenol resin (KAYAHARD GPH-103, manufactured by Nippon Kayaku Co., Ltd., hydroxyl equivalent: 231 g/eq.) (40 parts by weight), 45 parts by weight of a biphenylaralkyl epoxy resin (NC-3000-FH, epoxy equivalent: 321 g/eq., manufactured by Nippon Kayaku Co., Ltd.), and 15 parts by weight of bis(3-ethyl-5- methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), 20 parts by weight of a silicone resin powder (Tospearl120, manufactured by Momentive Performance Materials Japan LLC), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 8

A biphenyl aralkyl phenol resin (KAYAHARD GPH-103, manufactured by Nippon Kayaku Co., Ltd., hydroxyl equivalent: 231 g/eq.) (50 parts by weight), 30 parts by weight of a phenol novolak epoxy resin (EPICLON N-770, epoxy equivalent: 190 g/eq., manufactured by DIC), 5 parts by weight of a cresol novolak epoxy resin (EPICLON N-680, epoxy equivalent: 215 g/eq., manufactured by DIC), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 9

A biphenyl aralkyl phenol resin (KAYAHARD GPH-103, manufactured by Nippon Kayaku Co., Ltd., hydroxyl equivalent: 231 g/eq.) (55 parts by weight), 15 parts by weight of a naphthalene epoxy resin (EPICLON EXA-4032-70M, epoxy equivalent: 152 g/eq., manufactured by DIC), 15 parts by weight of a naphthalene skeleton tetrafunctional epoxy resin (EPICLON EXA-4710, epoxy equivalent: 170 g/eq., manufactured by DIC), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 10

A biphenyl aralkyl phenol resin (KAYAHARD GPH-103, manufactured by Nippon Kayaku Co., Ltd., hydroxyl equivalent: 231 g/eq.) (35 parts by weight), 50 parts by weight of a biphenylaralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 100 parts by weight of an E-glass filler (EGF, average particle diameter (D50) 1.41 μm, manufactured by Asahi Kasei EMD Corporation), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 11

A biphenyl aralkyl phenol resin (KAYAHARD GPH-103, manufactured by Nippon Kayaku Co., Ltd., hydroxyl equivalent: 231 g/eq.) (35 parts by weight), 50 parts by weight of a biphenylaralkyl epoxy resin (NC-3000-FH, epoxy equivalent: 321 g/eq., manufactured by Nippon Kayaku Co., Ltd.), 15 parts by weight of bis(3-ethyl-5-methyl-4-maleimidophenyl)methane (BMI-70, manufactured by K.I. Kasei K.K.), 1.5 parts by weight of a wetting/dispersing agent (BYK-W903, manufactured by Bik-Chemie Japan K.K.), 120 parts by weight of spherical fused silica particles (SC2050MOB, manufactured by Admatex), and 0.01 part by weight of imidazole (2E4MZ, manufactured by SHIKOKU CHEMICALS CORPORATION) were mixed together to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 3 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 12

A biphenyl aralkyl phenol resin (KAYAHARD GPH-103, manufactured by Nippon Kayaku Co., Ltd., hydroxyl equivalent: 231 g/eq.) (40 parts by weight), 55 parts by weight of a biphenylaralkyl epoxy resin (NC-3000-FH, epoxy equivalent: 321 g/eq., manufactured by Nippon Kayaku Co., Ltd.), and 5 parts by weight of a bismaleimide oligomer (DAIMIDO-100, manufactured by DAIWA KASEI KOGYO CO., LTD.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 13

A biphenyl aralkyl phenol resin (KAYAHARD GPH-103, manufactured by Nippon Kayaku Co., Ltd., hydroxyl equivalent: 231 g/eq.) (35 parts by weight), 5 parts by weight of an amino triazine novolak resin (EXB-9891, hydroxyl equivalent: 137 g/eq., manufactured by DIC), 45 parts by weight of a biphenylaralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 14

A biphenyl aralkyl phenol resin (KAYAHARD GPH-103, manufactured by Nippon Kayaku Co., Ltd., hydroxyl equivalent: 231 g/eq.) (35 parts by weight), 5 parts by weight of an amino triazine novolak resin (PHENOLITE LA-3018-50P, hydroxyl equivalent: 151 g/eq., manufactured by DIC), 45 parts by weight of a biphenylaralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 15

A biphenyl aralkyl phenol resin (KAYAHARD GPH-103, manufactured by Nippon Kayaku Co., Ltd., hydroxyl equivalent: 231 g/eq.) (20 parts by weight), 15 parts by weight of a naphthol aralkyl resin (SN-495, manufactured by Nippon Steel Chemical Co., Ltd., hydroxyl equivalent: 236 g/eq.), and 5 parts by weight of an amino triazine novolak resin (PHENOLITE LA-3018-50P, hydroxyl equivalent: 151 g/eq., manufactured by DIC), 45 parts by weight of a biphenylaralkyl epoxy resin (NC-3000-FH, epoxy equivalent: 321 g/eq., manufactured by Nippon Kayaku Co., Ltd.), and 15.0 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), and 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 16

A biphenyl aralkyl phenol resin (KAYAHARD GPH-103, manufactured by Nippon Kayaku Co., Ltd., hydroxyl equivalent: 231 g/eq.) (15 parts by weight), 15 parts by weight of a naphthalene skeleton phenol resin (EPICLON EXB-9500, manufactured by DIC, hydroxyl equivalent: 153 g/eq.), 5 parts by weight of an amino triazine novolak resin (PHENOLITE LA-3018-50P, hydroxyl equivalent: 151 g/eq., manufactured by DIC), 50 parts by weight of a biphenyl aralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 17

A biphenyl aralkyl phenol resin (KAYAHARD GPH-103, manufactured by Nippon Kayaku Co., Ltd., hydroxyl equivalent: 231 g/eq.) (35 parts by weight), 5 parts by weight of an amino triazine novolak resin (PHENOLITE LA-3018-50P, hydroxyl equivalent: 151 g/eq., manufactured by DIC), 45 parts by weight of a biphenyl aralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), 20 parts by weight of a silicone rubber powder having a surface coated with a silicone resin (silicone composite powder KMP-605, manufactured by The Shin-Etsu Chemical Co., Ltd.), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Example 18

A biphenyl aralkyl phenol resin (KAYAHARD GPH-103, manufactured by Nippon Kayaku Co., Ltd., hydroxyl equivalent: 231 g/eq.) (35 parts by weight), 5 parts by weight of an amino triazine novolak resin (PHENOLITE LA-3018-50P, hydroxyl equivalent: 151 g/eq., manufactured by DIC), 45 parts by weight of a biphenyl aralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), 20 parts by weight of a silicone resin powder (Tospearl120, manufactured by Momentive Performance Materials Japan LLC), 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 1

A naphthol aralkyl resin (SN-495, manufactured by Nippon Steel Chemical Co., Ltd., hydroxyl equivalent: 236 g/eq.) (35 parts by weight), 50 parts by weight of a biphenyl aralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 2

A cresol novolak resin (PHENOLITE KA-1165, manufactured by DIC, hydroxyl equivalent: 119 g/eq.) (25 parts by weight), 60 parts by weight of a biphenyl aralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 3

A phenol novolak resin (TD-2090, manufactured by DIC, hydroxyl equivalent: 105 g/eq.) (25 parts by weight), 60 parts by weight of a biphenyl aralkyl epoxy resin (NC-3000-FH, epoxy equivalent: 321 g/eq., manufactured by Nippon Kayaku Co., Ltd.), and 15 parts by weight of bis(3-ethyl- 5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 4

A naphthalene skeleton phenol resin (EPICLON EXB-9500, manufactured by DIC, hydroxyl equivalent: 153 g/eq.) (30 parts by weight), 55 parts by weight of a biphenyl aralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 5

A biphenyl aralkyl phenol resin (KAYAHARD GPH-103, manufactured by Nippon Kayaku Co., Ltd., hydroxyl equivalent: 231 g/eq.) (45 parts by weight) and 55 parts by weight of a biphenyl aralkyl epoxy resin (NC-3000-FH, epoxy equivalent: 321 g/eq., manufactured by Nippon Kayaku Co., Ltd.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 6

A biphenyl aralkyl phenol resin (KAYAHARD GPH-103, manufactured by Nippon Kayaku Co., Ltd., hydroxyl equivalent: 231 g/eq.) (20 parts by weight), 20 parts by weight of a naphthol aralkyl resin (SN-495, manufactured by Nippon Steel Chemical Co., Ltd., hydroxyl equivalent: 236 g/eq.), and 60 parts by weight of a biphenyl aralkyl epoxy resin (NC-3000-FH, epoxy equivalent: 321 g/eq., manufactured by Nippon Kayaku Co., Ltd.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 7

A biphenyl aralkyl phenol resin (KAYAHARD GPH-103, manufactured by Nippon Kayaku Co., Ltd., hydroxyl equivalent: 231 g/eq.) (20 parts by weight), 20 parts by weight of a cresol novolak resin (PHENOLITE KA-1165, manufactured by DIC, hydroxyl equivalent: 119 g/eq.), and 60 parts by weight of a biphenyl aralkyl epoxy resin (NC-3000-FH, epoxy equivalent: 321 g/eq., manufactured by Nippon Kayaku Co., Ltd.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 8

A biphenyl aralkyl phenol resin (KAYAHARD GPH-103, manufactured by Nippon Kayaku Co., Ltd., hydroxyl equivalent: 231 g/eq.) (15 parts by weight), 15 parts by weight of a phenol novolak resin (TD-2090, manufactured by DIC, hydroxyl equivalent: 105 g/eq.), and 70 parts by weight of a biphenyl aralkyl epoxy resin (NC-3000-FH, epoxy equivalent: 321 g/eq., manufactured by Nippon Kayaku Co., Ltd.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 9

A biphenyl aralkyl phenol resin (KAYAHARD GPH-103, manufactured by Nippon Kayaku Co., Ltd., hydroxyl equivalent: 231 g/eq.) (20 parts by weight), 20 parts by weight of a naphthalene skeleton phenol resin (EPICLON EXB-9500, manufactured by DIC, hydroxyl equivalent: 153 g/eq.), and 60 parts by weight of a biphenyl aralkyl epoxy resin (NC-3000-FH, epoxy equivalent: 321 g/eq., manufactured by Nippon Kayaku Co., Ltd.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 10

A biphenyl aralkyl phenol resin (KAYAHARD GPH-103, manufactured by Nippon Kayaku Co., Ltd., hydroxyl equivalent: 231 g/eq.) (25 parts by weight), 10 parts by weight of an amino triazine novolak resin (PHENOLITE LA-3018-50P, hydroxyl equivalent: 151 g/eq., manufactured by DIC), and 65 parts by weight of a biphenyl aralkyl epoxy resin (NC-3000-FH, epoxy equivalent: 321 g/eq., manufactured by Nippon Kayaku Co., Ltd.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 11

A biphenyl aralkyl phenol resin (KAYAHARD GPH-103, manufactured by Nippon Kayaku Co., Ltd., hydroxyl equivalent: 231 g/eq.) (14 parts by weight), 14 parts by weight of a naphthol aralkyl resin (SN-495, manufactured by Nippon Steel Chemical Co., Ltd., hydroxyl equivalent: 236 g/eq.), 10 parts by weight of an amino triazine novolak resin (PHENOLITE LA-3018-50P, hydroxyl equivalent: 151 g/eq., manufactured by DIC), and 62 parts by weight of a biphenyl aralkyl epoxy resin (NC-3000-FH, epoxy equivalent: 321 g/eq., manufactured by Nippon Kayaku Co., Ltd.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 12

A biphenyl aralkyl phenol resin (KAYAHARD GPH-103, manufactured by Nippon Kayaku Co., Ltd., hydroxyl equivalent: 231 g/eq.) (12 parts by weight), 12 parts by weight of a naphthalene skeleton phenol resin (EPICLON EXB-9500, manufactured by DIC, hydroxyl equivalent: 153 g/eq.), 10 parts by weight of an amino triazine novolak resin (PHENOLITE LA-3018-50P, hydroxyl equivalent: 151 g/eq., manufactured by DIC), and 66 parts by weight of a biphenyl aralkyl epoxy resin (NC-3000-FH, epoxy equivalent: 321 g/eq., manufactured by Nippon Kayaku Co., Ltd.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 13

A biphenyl aralkyl phenol resin (KAYAHARD GPH-103, manufactured by Nippon Kayaku Co., Ltd., hydroxyl equivalent: 231 g/eq.) (20 parts by weight), 20 parts by weight of an amino triazine novolak resin (PHENOLITE LA-3018-50P, hydroxyl equivalent: 151 g/eq., manufactured by DIC), and 60 parts by weight of a biphenyl aralkyl epoxy resin (NC-3000-FH, epoxy equivalent: 321 g/eq., manufactured by Nippon Kayaku Co., Ltd.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 14

A biphenyl aralkyl phenol resin (KAYAHARD GPH-103, manufactured by Nippon Kayaku Co., Ltd., hydroxyl equivalent: 231 g/eq.) (10 parts by weight), 10 parts by weight of a naphthol aralkyl resin (SN-495, manufactured by Nippon Steel Chemical Co., Ltd., hydroxyl equivalent: 236 g/eq.), 20 parts by weight of an amino triazine novolak resin (PHENOLITE LA-3018-50P, hydroxyl equivalent: 151 g/eq., manufactured by DIC), and 60 parts by weight of a biphenyl aralkyl epoxy resin (NC-3000-FH, epoxy equivalent: 321 g/eq., manufactured by Nippon Kayaku Co., Ltd.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 15

A biphenyl aralkyl phenol resin (KAYAHARD GPH-103, manufactured by Nippon Kayaku Co., Ltd., hydroxyl equivalent: 231 g/eq.) (10 parts by weight), 10 parts by weight of a naphthalene skeleton phenol resin (EPICLON EXB-9500, manufactured by DIC, hydroxyl equivalent: 153 g/eq.), 20 parts by weight of an amino triazine novolak resin (PHENOLITE LA-3018-50P, hydroxyl equivalent: 151 g/eq., manufactured by DIC), and 60 parts by weight of a biphenyl aralkyl epoxy resin (NC-3000-FH, epoxy equivalent: 321 g/eq., manufactured by Nippon Kayaku Co., Ltd.) were dissolved in and mixed with methyl ethyl ketone. Further, 1.5 parts by weight of a wetting/dispersing agent (BYK-W903, manufactured by Bik-Chemie Japan K.K.), 120 parts by weight of boehmite (APYRAL AOH60, manufactured by Nabaltec), and 0.01 part by weight of imidazole (2E4MZ, manufactured by SHIKOKU CHEMICALS CORPORATION) were mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 16

A biphenyl aralkyl phenol resin (KAYAHARD GPH-103, manufactured by Nippon Kayaku Co., Ltd., hydroxyl equivalent: 231 g/eq.) (35 parts by weight), 50 parts by weight of a biphenyl aralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 0.01 part by weight of imidazole (2E4MZ, manufactured by SHIKOKU CHEMICALS CORPORATION) was mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 17

A biphenyl aralkyl phenol resin (KAYAHARD GPH-103, manufactured by Nippon Kayaku Co., Ltd., hydroxyl equivalent: 231 g/eq.) (20 parts by weight), 20 parts by weight of a naphthol aralkyl resin (SN-495, manufactured by Nippon Steel Chemical Co., Ltd., hydroxyl equivalent: 236 g/eq.), 45 parts by weight of a biphenyl aralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 0.01 part by weight of imidazole (2E4MZ, manufactured by SHIKOKU CHEMICALS CORPORATION) was mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 18

A biphenyl aralkyl phenol resin (KAYAHARD GPH-103, manufactured by Nippon Kayaku Co., Ltd., hydroxyl equivalent: 231 g/eq.) (20 parts by weight), 20 parts by weight of a cresol novolak resin (PHENOLITE KA-1165, manufactured by DIC, hydroxyl equivalent: 119 g/eq.), 45 parts by weight of a biphenyl aralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 0.01 part by weight of imidazole (2E4MZ, manufactured by SHIKOKU CHEMICALS CORPORATION) was mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 19

A biphenyl aralkyl phenol resin (KAYAHARD GPH-103, manufactured by Nippon Kayaku Co., Ltd., hydroxyl equivalent: 231 g/eq.) (20 parts by weight), 20 parts by weight of a phenol novolak resin (TD-2090, manufactured by DIC, hydroxyl equivalent: 105 g/eq.), 45 parts by weight of a biphenyl aralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 0.01 part by weight of imidazole (2E4MZ, manufactured by SHIKOKU CHEMICALS CORPORATION) was mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

Comparative Example 20

A phenyl aralkyl phenol resin (KAYAHARD GPH-103, manufactured by Nippon Kayaku Co., Ltd., hydroxyl equivalent: 231 g/eq.) (20 parts by weight), 20 parts by weight of a naphthalene skeleton phenol resin (EPICLON EXB-9500, manufactured by DIC, hydroxyl equivalent: 153 g/eq.), 45 parts by weight of a biphenyl aralkyl epoxy resin (NC-3000-FH, epoxy equivalent: 321 g/eq., manufactured by Nippon Kayaku Co., Ltd.), and 15 parts by weight of bis(3-ethyl-5-methyl-4-maleimidophenyl)methane (BMI-70, manufactured by K.I. Kasei K.K.) were dissolved in and mixed with methyl ethyl ketone. Further, 0.01 part by weight of imidazole (2E4MZ, manufactured by SHIKOKU CHEMICALS CORPORATION) was mixed thereinto to obtain a varnish. The varnish was diluted with methyl ethyl ketone. The diluted varnish was impregnated into and coated on a 0.1 mm-thick E-glass woven fabric. The impregnated and coated E-glass woven fabric was heat-dried at 160° C. for 5 min to obtain a prepreg having a resin content of 47.5% by weight.

A copper-clad laminated sheet having a 0.4 mm-thick insulating layer was obtained in the same manner as in Example 1, except that the prepreg obtained just above was used.

<Evaluation of Metal Foil-Clad Laminated Sheets>

Flame retardance, water absorption, heat resistance, reflow resistance, and drilling workability were evaluated for the metal foil-clad laminated sheets thus obtained. The copper foil in the metal foil-clad laminated sheet was removed by etching the metal foil-clad laminated sheet before the flame resistance and the water absorption were evaluated by the following method.

(1) Combustion Test

Evaluated according to a UL94 vertical combustion testing method.

(2) Water Absorption

A sample that has a size of 50×50 mm and has been previously dried in a drier at 125° C. for 2 hr was allowed to stand under conditions of 121° C. and 2 atm for 5 hr with a pressure cooker testing apparatus (manufactured by HIRAYAMA MANUFACTURING CORPORATION), a change in weight of the sample from the weight of the sample before the standing was determined, and a percentage increase in weight of the sample from the weight before the standing was calculated as a water absorption (% by weight).

The heat resistance, reflow resistance, and drilling workability of the metal foil-clad laminated sheets were evaluated by the following methods.

(3) Heat Resistance

A sample having a size of 50×50 mm was floated in a solder of 280° C. for 30 min, and delamination was visually inspected. The results were evaluated according to the following criteria.

○: No abnormal phenomenon x: Delaminated during floating of 0 to 30 min (4) Reflow Resistance A metal foil-clad laminated sheet with a pattern having a percentage residual copper of 63% formed on both surfaces thereof was provided as an internal layer core. A resin sheet (ABF GX-13, thickness 37.5 μm, manufactured by Ajinomoto Fine-Techno. Co. Inc.) was stacked thereon, and a 12 μm-thick copper foil was built up on the outermost layer, followed by heating in a drier at 180° C. for 1.5 hr to prepare a four-layered board. The board was cut into a size of 120×60 mm, and reflow was performed 20 times at a highest possible temperature of 280° C. with a solder reflow apparatus (Salamander, manufactured by Shimadzu Seisakusho Ltd.), followed by visual inspection for delamination of the build-up layer. The results were evaluated according to the following criteria.

○: No abnormal phenomenon x: Delaminated (5) Drilling Workability

Four sheets of the metal-clad laminated sheet were put on top of each other. Drilling was performed using PS-1160G (manufactured by Risho Kogyo Co., Ltd.) as a backup board and LE450 (manufactured by Mitsubishi Gas Chemical Company, Inc.) as an entry sheet with ND-1 V212 (manufactured by Hitachi Via Asia Pte. Ltd.) under conditions of a rotating speed of 2000 kpm and a feed rate of 2.0 m/min, and positions of 9000 to 10000 holes were measured with an analyzer.

The results of evaluation of the flame retardance, water absorption, heat resistance, reflow resistance, and drilling workability were as shown in Tables 1 to 4. Numerical values in "Resin composition" in the table are in parts by weight.

TABLE 1

| | | Example | | | | | | | | |
|---|---|---|---|---|---|---|---|---|---|---|
| Resin composition | | 1 | 2 | 3 | 4 | 5 | 6 | 7 | 8 | 9 |
| Evaluation | Flame retardance | V-0 | V-0 | V-0 | V-0 | V-0 | V-0 | V-0 | V-0 | V-0 |
| | Water absorption (wt %) | 0.42 | 0.40 | 0.42 | 0.43 | 0.43 | 0.43 | 0.42 | 0.44 | 0.43 |
| | Heat resistance | ○ | ○ | ○ | ○ | ○ | ○ | ○ | ○ | ○ |
| | Reflow resistance | ○ | ○ | ○ | ○ | ○ | ○ | ○ | ○ | ○ |
| | Drillability (μm) | 40 | 45 | 45 | 45 | 45 | 40 | 40 | 40 | 40 |

TABLE 2

| | | Example | | | | | | | | |
|---|---|---|---|---|---|---|---|---|---|---|
| Resin composition | | 10 | 11 | 12 | 13 | 14 | 15 | 16 | 17 | 18 |
| Evaluation | Flame retardance | V-0 | V-0 | V-0 | V-0 | V-0 | V-0 | V-0 | V-0 | V-0 |
| | Water absorption (wt %) | 0.41 | 0.38 | 0.39 | 0.42 | 0.44 | 0.41 | 0.45 | 0.42 | 0.43 |
| | Heat resistance | ○ | ○ | ○ | ○ | ○ | ○ | ○ | ○ | ○ |
| | Reflow resistance | ○ | ○ | ○ | ○ | ○ | ○ | ○ | ○ | ○ |
| | Drillability (μm) | 40 | 40 | 40 | 40 | 40 | 40 | 40 | 40 | 40 |

TABLE 3

| | | Comparative Example | | | | | | | | | |
|---|---|---|---|---|---|---|---|---|---|---|---|
| Resin composition | | 1 | 2 | 3 | 4 | 5 | 6 | 7 | 8 | 9 | 10 |
| Evaluation | Flame retardance | V-0 | V-0 | V-0 | V-0 | V-1 | V-1 | V-1 | V-1 | V-1 | V-1 |
| | Water absorption (wt %) | 0.40 | 0.42 | 0.43 | 0.41 | 0.48 | 0.45 | 0.48 | 0.48 | 0.49 | 0.55 |
| | Heat resistance | ○ | ○ | ○ | ○ | x | x | x | x | x | ○ |
| | Reflow resistance | ○ | ○ | ○ | ○ | x ○ | x | x | x | x | x |
| | Drillability (μm) | 50 | 50 | 50 | 55 | 40 | 45 | 45 | 45 | 45 | 40 |

TABLE 4

| | | Comparative Example | | | | | | | | | |
|---|---|---|---|---|---|---|---|---|---|---|---|
| Resin composition | | 11 | 12 | 13 | 14 | 15 | 16 | 17 | 18 | 19 | 20 |
| Evaluation | Flame retardance | V-1 | V-1 | V-0 | V-0 | V-0 | V-1 | V-1 | Total loss by fire | Total loss by fire | Total loss by fire |
| | Water absorption (wt %) | 0.53 | 0.52 | 0.54 | 0.53 | 0.49 | 0.51 | 0.48 | 0.55 | 0.54 | 0.52 |
| | Heat resistance | x | ○ | x | x | x | x | ○ | x | x | x |
| | Reflow resistance | x | x | x | x | x | ○ | ○ | x | x | ○ |
| | Drillability (μm) | 45 | 45 | 40 | 45 | 45 | 30 | 40 | 35 | 35 | 40 |

As is apparent from Tables 1 and 2, all the metal foil-clad laminated sheets prepared using the resin compositions of Examples 1 to 18 exhibited excellent results in terms of flame retardance, water absorption, heat resistance, reflow resistance, and drilling workability. On the other hand, as is apparent from Tables 3 and 4, none of the metal foil-clad laminated sheets prepared using the resin compositions of Comparative Examples 1 to 18 had a good balance among the flame retardance, the water absorption, the heat resistance, the reflow resistance, and the drilling workability, and any of the properties was poor. Further, the following facts can be said from the evaluation results.

1) For Comparative Examples 1 to 4 where, instead of the biphenyl aralkyl resin used in Example 1, other phenolic resin is used, the drilling workability is poor.

2) For Comparative Examples 5 to 9 where the bismleimide used in Examples 1 to 5 is not contained, the heat resistance, the reflow resistance, and the flame retardance are poor.

3) For Comparative Examples 10 to 12 where the bismaleimide used in Examples 1, 2, and 5 is not contained and, for flame retarding purposes, a nitrogen-containing amino triazine novolak resin is added, the flame retarding effect is low and, at the same time, the reflow resistance of the resin is poor due to liberation of nitrogen at an elevated temperature.

4) For Comparative Examples 13 to 15 where the bismaleimide used in Examples 1, 2, and 5 is not contained and, from the viewpoint of further enhancing flame retardance from Comparative Examples 10 to 12, the addition amount of the nitrogen-containing amino triazine novolak resin is increased, satisfactory flame retardance can be provided, but on the other hand, the reflow resistance of the resin but also the heat resistance is deteriorated due to liberation of nitrogen at an elevated temperature.

5) For Comparative Examples 16 to 20 where boehmite used in Examples 1 to 5 is not contained, satisfactory drilling workability is provided, but on the other hand, the flame retardance and the water absorption are poor.

The laminated sheets prepared using resin compositions according to the present invention, while maintaining excellent flame retardance, have excellent heat resistance, reflow resistance, and drilling workability, and, at the same time, have low water absorption without use of halogen compounds and phosphorus compounds.

The invention claimed is:

1. A resin composition comprising:
   20 to 60 parts by weight of a non-halogen epoxy resin (A) based on 100 parts by weight in total weight of the non-halogen epoxy resin (A), the biphenyl aralkyl phenolic resin (B) and the maleimide compound (C);
   5 to 55 parts by weight of a biphenyl aralkyl phenolic resin (B) based on 100 parts by weight in total weight of the non-halogen epoxy resin (A), the biphenyl aralkyl phenolic resin (B) and the maleimide compound (C);
   5 to 50 parts by weight of a maleimide compound (C) based on 100 parts by weight in total weight of the non-halogen epoxy resin (A), the biphenyl aralkyl phenolic resin (B) and the maleimide compound (C);
   50 to 150 parts by weight of an inorganic filler (D) based on 100 parts by weight in total weight of the non-halogen epoxy resin (A), the biphenyl aralkyl phenolic resin (B) and the maleimide compound (C); and
   1 to 30 parts by weight of a silicone powder (F); based on 100 parts by weight in total weight of the non-halogen epoxy resin (A), the biphenyl aralkyl phenolic resin (B) and the maleimide compound (C),
   wherein the non-halogen epoxy resin (A) is at least one selected from the group consisting of phenol phenyl aralkyl epoxy resins, phenol biphenyl aralkyl epoxy resins, and naphthol aralkyl epoxy resins,
   the biphenyl aralkyl phenol resin (B) is represented by formula (I):

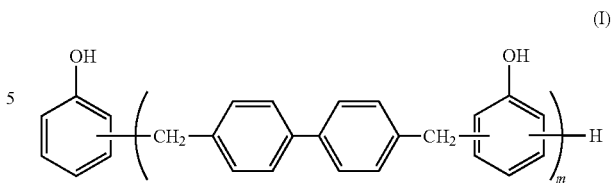

wherein m is an integer of 1 or more,
the maleimide compound (C) is bis(3-ethyl-5-methyl-4-maleimidophenyl)methane,
the inorganic filler (D) is boehmite, and
the silicone powder (F) is a silicone rubber spherical microparticle coated with a polyorganosilsesquioxane resin and having a particle size distribution of 0.7~5 μm surface.

2. The resin composition according to claim 1, wherein the biphenyl aralkyl phenol resin (B) is contained in an amount that meets a requirement of an OH/Ep ratio of 0.7 to 1.4 wherein OH represents the number of hydroxyl groups in the biphenyl aralkyl phenol resin; and Ep represents the number of epoxy groups in the non-halogen epoxy resin (A).

3. The resin composition according to claim 1, which further comprises (E) a naphthol aralkyl resin.

4. The resin composition according to claim 3, wherein the content of the naphthol aralkyl resin (E) is not more than 80% by weight based on the total amount of phenolic resins including the biphenyl aralkyl phenol resin (B).

5. A prepreg comprising:
   a base material; and
   the resin composition according to claim 1, impregnated into or coated on the base material.

6. A laminated sheet comprising a lamination-molded product of the prepreg according to claim 5.

7. A metal foil-clad laminated sheet comprising:
   a lamination-molded product of the prepreg according to claim 5 and
   a metal foil provided on the prepreg.

8. The resin composition according to claim 1, wherein the content of the non-halogen epoxy resin (A) is 40 to 60 parts by weight based on 100 parts by weight of the total amount of the components (A), (B) and (C).

9. The resin composition according to claim 1, wherein the content of inorganic filler (D) is 50 to 100 parts by weight, based on 100 parts by weight in total weight of the non-halogen epoxy resin (A), the biphenyl aralkyl phenolic resin (B) and the maleimide compound (C).

10. The resin composition according to claim 1, wherein the content of inorganic filler (D) is 50 to 120 parts by weight, based on 100 parts by weight in total weight of the non-halogen epoxy resin (A), the biphenyl aralkyl phenolic resin (B) and the maleimide compound (C).

* * * * *